US008450841B2

(12) United States Patent
Ong et al.

(10) Patent No.: US 8,450,841 B2
(45) Date of Patent: May 28, 2013

(54) BONDED WIRE SEMICONDUCTOR DEVICE

(75) Inventors: Li Ting Celina Ong, Kuala Lumpur (MY); Yin Kheng Au, Petaling Jaya (MY); Zi-Song Poh, Malacca (MY)

(73) Assignee: Freescale Semiconductor, Inc., Austin, TX (US)

( * ) Notice: Subject to any disclaimer, the term of this patent is extended or adjusted under 35 U.S.C. 154(b) by 120 days.

(21) Appl. No.: 13/195,042

(22) Filed: Aug. 1, 2011

(65) Prior Publication Data

US 2013/0032932 A1    Feb. 7, 2013

(51) Int. Cl.
*H01L 23/48* (2006.01)
*H01L 23/495* (2006.01)

(52) U.S. Cl.
CPC ................ *H01L 23/49541* (2013.01)
USPC ...... 257/695; 257/E23.07; 257/670; 257/692; 257/786; 438/123

(58) Field of Classification Search
CPC ................ H01L 2224/49171; H01L 23/49541
USPC ..................... 257/E21.504, E23.07, 666, 670, 257/692, 694–696, 784, 786; 438/FOR. 366, 438/FOR. 367, FOR. 377, FOR. 380, 111, 438/112, 123
See application file for complete search history.

(56) References Cited

U.S. PATENT DOCUMENTS

| | | | | |
|---|---|---|---|---|
| 5,168,368 A * | 12/1992 | Gow et al. | ...................... | 257/666 |
| 5,498,767 A * | 3/1996 | Huddleston et al. | .......... | 716/122 |
| 5,632,083 A * | 5/1997 | Tada et al. | ........................ | 29/827 |
| 5,753,977 A * | 5/1998 | Kusaka et al. | ................. | 257/787 |
| 5,818,114 A * | 10/1998 | Pendse et al. | ................. | 257/786 |
| 6,225,685 B1 | 5/2001 | Newman et al. | | |
| 6,265,762 B1 * | 7/2001 | Tanaka et al. | ................. | 257/676 |
| 6,323,548 B1 * | 11/2001 | Hiraga | ........................ | 257/692 |
| 6,472,729 B1 * | 10/2002 | Oka | .............................. | 257/676 |
| 6,750,533 B2 * | 6/2004 | Wang et al. | ..................... | 257/667 |
| 6,803,258 B2 * | 10/2004 | Ito et al. | ........................ | 438/123 |
| 7,411,287 B2 * | 8/2008 | Ding | ........................... | 257/692 |
| 7,420,286 B2 * | 9/2008 | Kramer | ........................ | 257/784 |
| 7,535,084 B2 * | 5/2009 | Kim | ................................ | 257/666 |
| 7,541,222 B2 * | 6/2009 | Magno et al. | ................. | 438/125 |
| 2004/0000726 A1 * | 1/2004 | Lee et al. | ...................... | 257/784 |
| 2007/0007669 A1 * | 1/2007 | Hsu et al. | ...................... | 257/784 |

* cited by examiner

*Primary Examiner* — Chris Chu
(74) *Attorney, Agent, or Firm* — Charles Bergere

(57) ABSTRACT

A bonded wire semiconductor device includes a sub-assembly including a semiconductor die having an active face with a set of internal electrical contact elements and an externally exposed set of electrical contact elements. A set of bond wires make respective electrical connections between the internal electrical contact elements and the externally exposed set of electrical contact elements. A molding compound encapsulates the semiconductor die with the active face embedded in the molding compound. The bond wires have the same length. The bond wires are bonded to the internal electrical contact elements and to the externally exposed electrical contact elements at first and second curved arrays and of bond positions respectively. The first and second curved arrays and of bond positions have corresponding concentric shapes.

12 Claims, 4 Drawing Sheets

PRIOR ART

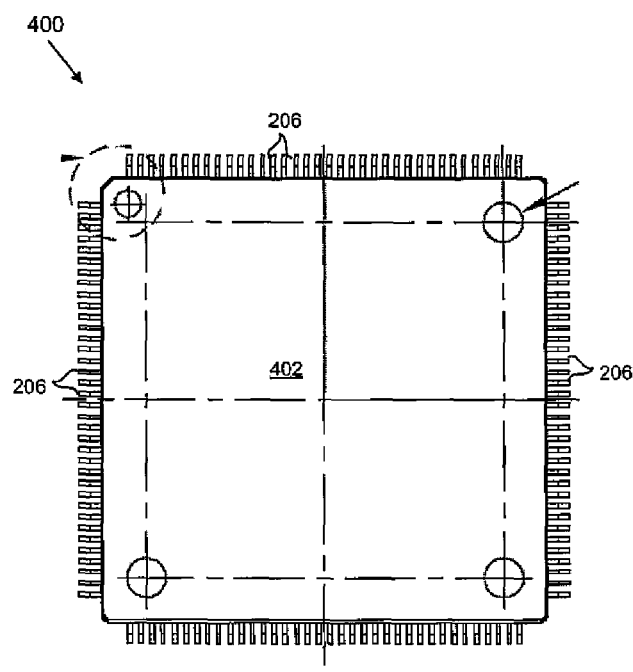
TOP VIEW  Fig. 4A
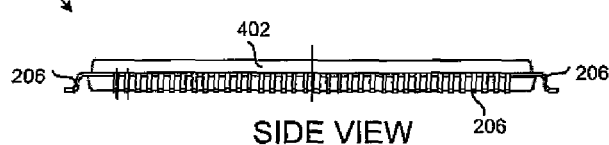
SIDE VIEW  Fig. 4B

BONDED WIRE SEMICONDUCTOR DEVICE

BACKGROUND OF THE INVENTION

The present invention is directed to semiconductor device packaging and, more particularly, to a bonded wire semiconductor device.

Semiconductor device packaging fulfils basic functions such as providing electric connections and protecting the die against mechanical and environmental stresses. Continued progress in reducing the size of the semiconductor dies and increasing functionality and complexity of the electronic circuits integrated in the dies requires size reduction of the packaging with the same or greater complexity of the electrical connections with external circuits.

Semiconductor devices are commonly packaged for surface mounting by embedding one or more semiconductor dies. Exposed electrical contacts for connection with external circuits are integrated in the package and are connected internally with electrical contact elements such as pads on the semiconductor die. Various techniques are available for connecting the exposed electrical contacts of the package with the embedded semiconductor die.

In a bonded wire package, the semiconductor die may be mounted on a substrate with the contact pads of the semiconductor die on its active face opposite from the substrate. Wires are then bonded to the contact pads of the semiconductor die and to inner ends of the exposed electrical contacts of the package to provide the internal connections. The substrate may be an electrically conductive lead frame, whose frame members are cut off and discarded during production after applying molding compound to encapsulate the semiconductor die, the bond wires and the inner ends of the exposed electrical contacts.

Size reduction of the dies and the packaging with the same or greater complexity of the electrical connections means that the pitch of the bond pads on the die and the pitch of the exposed electrical contacts is reduced. This aggravates the risk of defects caused by electrical contact between adjacent bond wires. Bond wires are not straight but extend in loops. The curvature of the bond wire loops can lead to sway of the loops from a vertical direction and sweep of the loops horizontally. Bond wire sway and sweep may especially be caused by flow of the molding compound during its injection.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

FIGS. 4A and 4B show plan and side views, respectively, of a finished bonded wire semiconductor device including the sub-assembly of FIGS. 2 and 3.

DETAILED DESCRIPTION OF THE INVENTION

Figure 1:
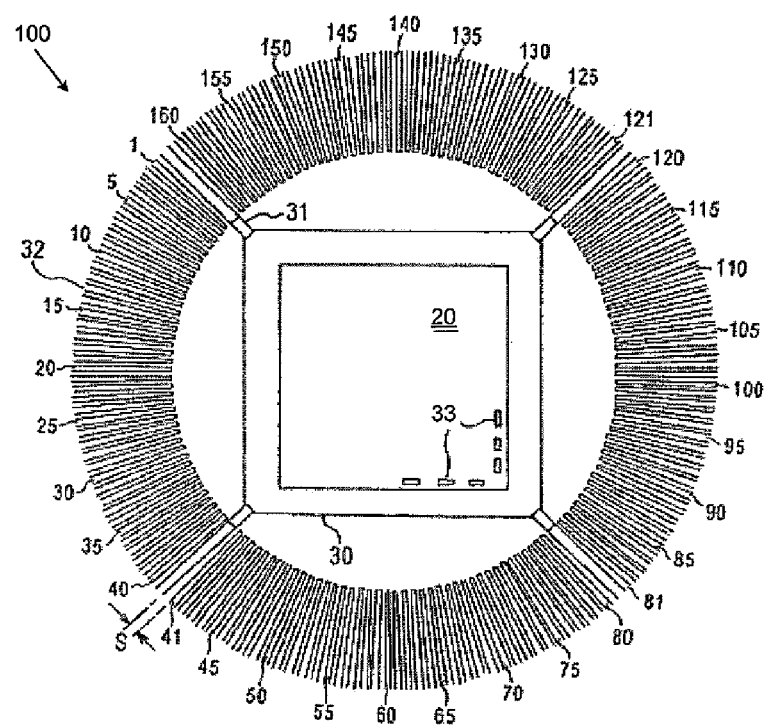
FIG. 1 is a schematic plan view of a sub-assembly including a semiconductor die mounted on a lead frame in a known bonded wire semiconductor device at a stage in its manufacture.

FIG. 1 shows a sub-assembly 100 in a known bonded wire semiconductor device at an intermediate stage in its manufacture. The sub-assembly 100 comprises a square semiconductor die 20 and a lead frame including a square die pad 30 with tie bars 31 extending from the corners thereof. The lead frame also comprises a plurality of lead fingers 32 (with identification numbers shown from 1 to 160) whose inner ends are arranged in a circular array about the die pad 30. Each of the lead fingers 32 connects to a corresponding bond pad 33 on the semiconductor die 20 with a bond wire (not shown). The bond wires are bonded to the lead fingers 32 at their outer ends and to the bond pads 33 at their inner ends. The lead fingers 32 are arranged in a circular disposition such that the pitch and width of the lead fingers 32 may be relatively constant around the circumference of the lead frame.

In the sub-assembly 100, the inner ends of the lead fingers 32 are arranged in a circular array whereas the bond pads 33 are arranged in a square array. This configuration results in a smaller distance from the lead fingers 32 to the bond pads 33 at the corners of the semiconductor die 20 than at the middles of the sides of the semiconductor die 20. On the other hand, in another known configuration where the inner ends of the lead fingers 32 are arranged in a square array, of similar shape to the square array of the bond pads 33, the distance from the lead fingers 32 to the bond pads 33 at the corners of the semiconductor die 20 is greater than at the middles of the sides of the semiconductor die 20. In both cases, the lengths of the bond wires and the height of the bond wire loops vary around the semiconductor die 20, leading to a risk of defects caused by electrical contact between adjacent bond wires caused by different amounts of bond wire sway and sweep, even if kinks are introduced in the bond wires to reduce the risk.

Figure 2:
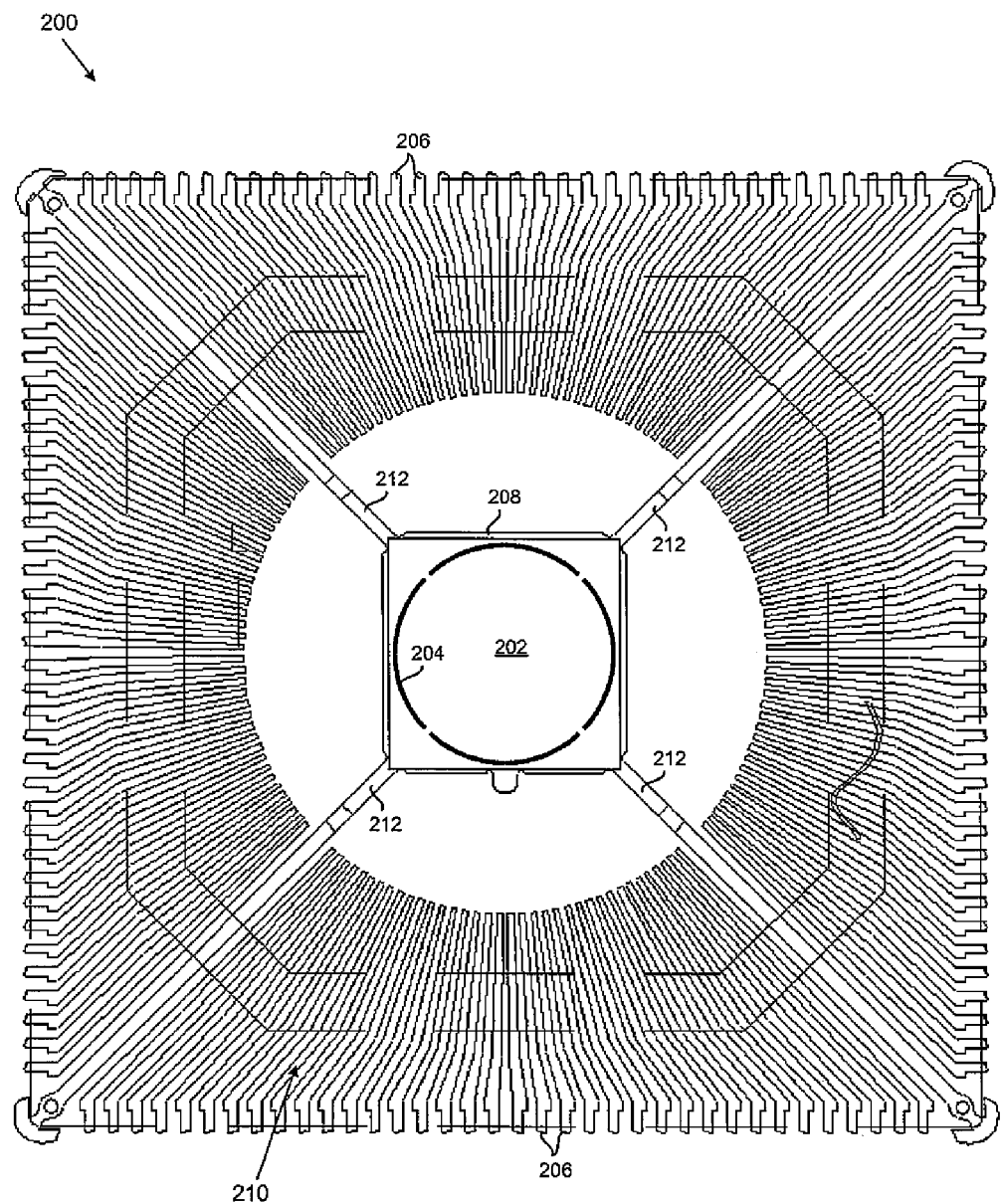
FIG. 2 is a schematic plan view of a sub-assembly including a semiconductor die mounted on a lead frame in a bonded wire semiconductor device in accordance with one embodiment of the invention.
Figure 3:
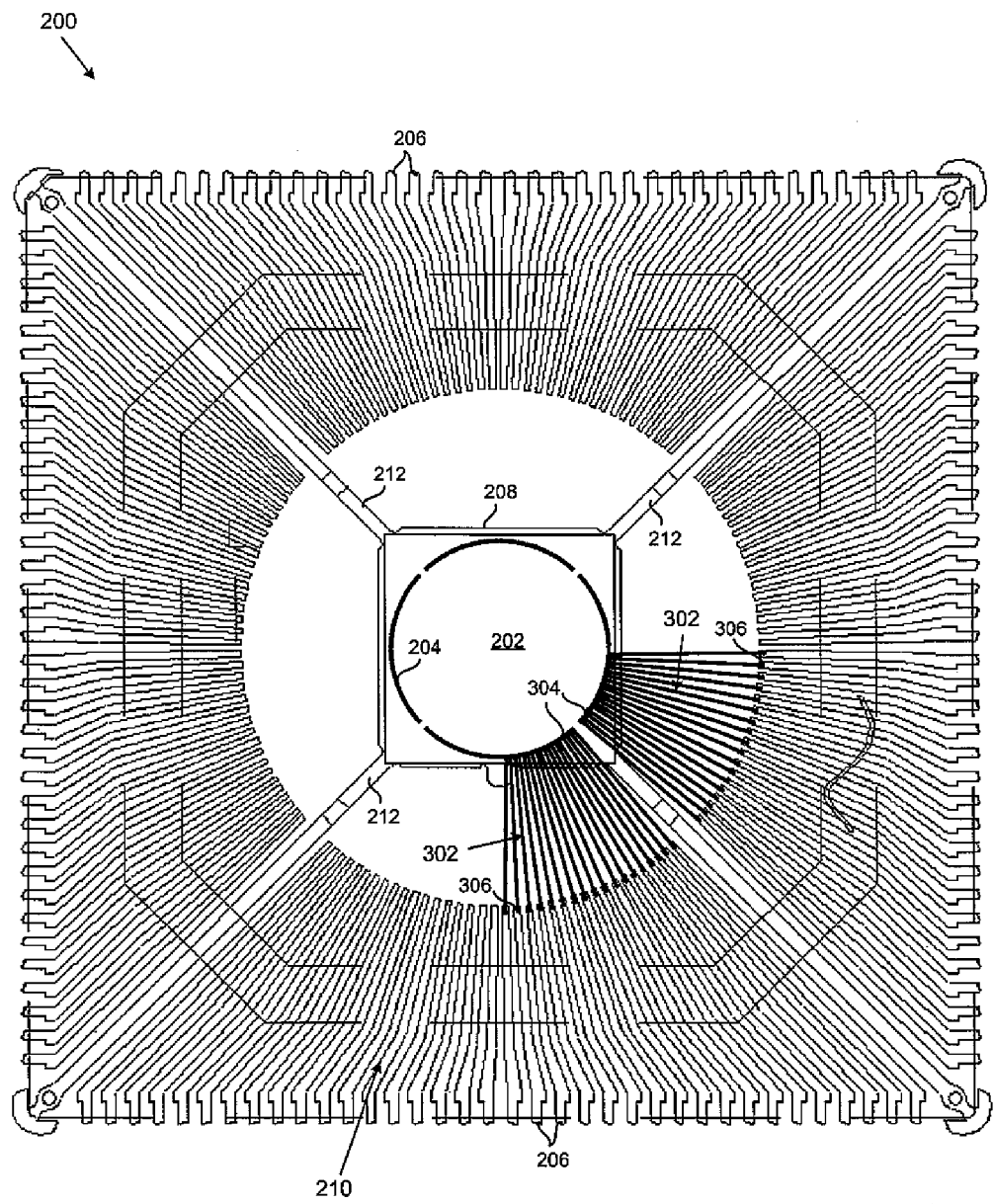
FIG. 3 is a schematic plan view of the sub-assembly of FIG. 2 with bond wires at a later stage in its manufacture.

FIGS. 2 to 4 show an example of a bonded wire semiconductor device in accordance with an embodiment of the present invention at various stages in its manufacture. The semiconductor device comprises a sub-assembly 200 including a semiconductor die 202 having an active face with a set of internal electrical contact elements 204 and an externally exposed set of electrical contact elements 206. A set of bond wires 302 (FIG. 3) make respective electrical connections between the internal electrical contact elements 204 and the externally exposed set of electrical contact elements 206. In a finished semiconductor device 400 (FIG. 4), a molding compound 402 encapsulates the semiconductor die 202 with the active face of the die embedded in the molding compound 402.

The bond wires 302 have substantially the same length. The bond wires 302 are bonded to the internal electrical contact elements 204 and to the externally exposed electrical contact elements 206 at first and second curved arrays 304 and 306 of bond positions respectively. The first and second curved arrays 304 and 306 of bond positions have corresponding concentric shapes.

FIGS. 2 to 4 show an example of an embodiment of the invention as applied to a quad flat package, in which the external contacts 206 are in the form of leads projecting from all four sides of the molding compound 402 in the finished semiconductor device 400. In other embodiments of the invention, the finished semiconductor device 400 has external contacts that are flush with the edges and face of the molding compound 402 in the finished semiconductor device 400. Other embodiments of the invention are applied to dual in-line (DIP) or small-outline integrated circuit (SOIC) packages, in which the external contacts 206 are provided only at two opposite sides of the finished semiconductor device 400. The finished semiconductor device 400 is square. However in other embodiments of the invention, the finished semiconductor device is oblong.

In more detail, FIGS. 2 and 3 show one unit of a lead frame including the sub-assembly 200. The lead frame comprises a series of similar such sub-assembly units, which may be disposed in a row in a one dimensional array, or may be disposed in columns and rows in a two-dimensional array. The series of sub-assembly units 200 may be processed together during the various stages of manufacture until singulation, after molding for example. The sub-assembly 200 of the lead frame comprises a die pad 208 on which the semiconductor die 202 is mounted and lead fingers 210 whose outer ends form the external contacts 206. The semiconductor die 202 is mounted on the die pad 208 with its active face up. The set of internal electrical contact elements 204 are provided by bond pads on the active face of the semiconductor die 202. Typically, the bond pads on the active face extend over and above active areas of the integrated circuit of the semiconductor die 202. Until encapsulation, when the molding compound 402 provides support for the components of the finished device 400, the die pad 208 and the semiconductor die 202 are supported through tie bars 212 by a frame structure (not shown) which also supports the lead fingers 210. Upon singulation, the frame structure is separated from the lead fingers 210 and the tie bars 212 and is discarded.

FIG. 3 shows the sub-assembly 200 at a stage where approximately one quarter of the bond wires 302 have been positioned and bonded. In this embodiment of the invention, each bond pad forming an internal electrical contact element 204 is connected by a single bond wire 302 to a respective lead finger 212. However, in other embodiments of the invention, a bond pad may be connected by more than one bond wire 302 to one or more lead fingers 212 and a lead finger 212 may be connected by more than one bond wire 302 to one or more bond pads. In this embodiment of the invention, each bond pad forming an internal electrical contact element 204 is of quadrilateral shape, having two sides that are radial and two sides that are tangential. However, in other embodiments of the invention, a quadrilateral bond pad may be oriented at an angle to the radii and the tangents. In yet other embodiments of the invention each bond pad forming an internal electrical contact element 204 is curved or other shape and may have a surface area greater than the minimum necessary for the bond of the corresponding wire or wires 302.

In this embodiment of the invention, the bond wires 302 are bonded adjacent the inner ends of the lead fingers 212, which terminate on a curve of similar shape to the second curved array 306 of bond positions on the lead fingers. In another embodiment of the invention (not shown), the inner ends of the lead fingers 212 extend further in towards the semiconductor die 202 beyond the second curved array 306 of bond positions and may terminate on a curve of different shape than the first and second curved arrays 304 and 306 of bond positions. In one embodiment of the invention, the die pad 208 and the tie bars 212 are omitted and the semiconductor die 202 is mounted on the inner ends of the lead fingers 212.

In this example of an embodiment of the invention, the first and second curved arrays 304 and 306 of bond positions have similar concentric shapes, that is to say that uniform scaling of the shapes would result in identical shapes. However, in the case of oval shapes of the first and second curved arrays 304 and 306 of bond positions, the arrays may have corresponding concentric shapes which have different aspect ratios, so that the bond wires 302 have substantially the same length. The first and second curved arrays 304 and 306 of bond positions are concentric but may be in different planes parallel to the active face of the semiconductor die 202. The second curved array 306 of bond positions has a greater size than the first curved array 304 of bond positions and is disposed outside the first curved array 304. The first and second curved arrays 304 and 306 of bond positions may be complete or almost complete closed curves, in the case of a quad flat package, for example. The first and second curved arrays 304 and 306 of bond positions may alternatively be arcs which are only parts of complete closed curves, in the case of a dual in-line or SOIC package, for example.

The semiconductor die 202 is substantially square (apart from chamfered corners) in this example and the first and second curved arrays 304 and 306 of bond positions are generally circular curves, which are interrupted at the tie bars 212 in this example. In another embodiment of the invention (not shown) the semiconductor die 202 is oblong and the first and second curved arrays 304 and 306 of bond positions are generally oval curves. The shapes of the oval curves may be sufficiently similar to enable the bond wires to be all of substantially the same length. The oval curves of the first and second curved arrays 304 and 306 of bond positions may be generally elliptical curves. In yet another embodiment of the invention (not shown) the semiconductor device comprises more than one semiconductor die 202 in the same package. Where the semiconductor device comprises more than one semiconductor die 202, the first curved array 304 of bond positions may comprise respective generally oval arcs on the different semiconductor dies 202.

The bond wires 302 are bonded at their inner and outer ends to the set of internal electrical contact elements 204 and to the lead fingers 212 respectively. The bond wires 302 extend in loops perpendicularly to the active face of the semiconductor die 202. The loops all have substantially the same length and height in the sub-assembly 200. Since the bond positions of the first and second curved arrays 304 and 306 extend in similar concentric curved shapes, the spacing of the bonds may be optimized around the lead frame. The risk of defects caused by electrical contact between adjacent bond wires caused by different amounts of bond wire sway and sweep is reduced. The risk of defects can be reduced even if the manufacturing process is simplified by eliminating kinks in the bond wires.

The lengths and heights of the loops of the bond wires 302 in the sub-assembly 200 are substantially the same. The differences in length and/or height of the loops that can be tolerated depend on the physical configuration. The tolerances can be optimized by empirical experimentation. By way of example, in one embodiment of the invention, differences up to 10% between adjacent bond wire loops could be tolerated. In another embodiment of the invention, it was found necessary to limit differences between adjacent bond wire loops to no more than 5%. In yet another embodiment of the invention, it was found possible to limit differences between adjacent bond wire loops to 1% and the risk of defects was reduced to a statistically insignificant value.

In the foregoing specification, the invention has been described with reference to specific examples of embodiments of the invention. It will, however, be evident that various modifications and changes may be made therein without departing from the broader spirit and scope of the invention as set forth in the appended claims. For example, the semiconductor die described herein can be any semiconductor material or combinations of materials, such as gallium arsenide, silicon germanium, silicon-on-insulator (SOI), silicon, monocrystalline silicon, the like, and combinations of the above.

The terms "front," "back," "top," "bottom," "over," "under" and the like are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. However, other modifications, variations and alternatives are also possible. The specifications and drawings are, accordingly, to be regarded in an illustrative rather than in a restrictive sense.

In the claims, the word 'comprising' does not exclude the presence of other elements or steps then those listed in a claim. Further, the terms "a" or "an," are defined as one or more than one. Also, the use of introductory phrases such as "at least one" and "one or more" should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A bonded wire semiconductor device, comprising:
a semiconductor die having an active face with a set of internal electrical contact elements;
a set of externally exposed electrical contact elements;
a set of bond wires making respective electrical connections between said internal electrical contact elements and said externally exposed electrical contact elements, wherein said bond wires are of substantially the same length; and
a molding compound encapsulating said semiconductor die with said active face embedded in said molding compound,
wherein said bond wires are bonded to said internal electrical contact elements and to said externally exposed electrical contact elements at first and second curved arrays of bond positions respectively and said first and second curved arrays of bond positions have corresponding concentric shapes.

2. The semiconductor device of claim 1, wherein said second curved array of bond positions has a greater size than said first curved array of bond positions.

3. The semiconductor device of claim 1, wherein said bond wires are bonded to said externally exposed electrical contact elements adjacent inner ends of said externally exposed electrical contact elements, which terminate on a curve of similar shape to said second curved array of bond positions.

4. The semiconductor device of claim 3, wherein said semiconductor die is substantially square and said first and second curved arrays of bond positions are generally circular curves.

5. The semiconductor device of claim 4, wherein said first and second curved arrays of bond positions are generally elliptical curves.

6. The semiconductor device of claim 1, wherein said first and second curved arrays of bond positions have similar concentric shapes.

7. The semiconductor device of claim 1, wherein said semiconductor die is oblong and said first and second curved arrays of bond positions are generally oval curves.

8. The semiconductor device of claim 1, wherein differences in length between said bond wires are less than 10%.

9. The semiconductor device of claim 1, wherein differences in length between said bond wires are less than 5%.

10. The semiconductor device of claim 1, wherein said bond wires extend perpendicularly to said active face in loops that have substantially the same length and height.

11. The semiconductor device of claim 10, wherein differences in length and height between said loops in said bond wires are less than 10%.

12. The semiconductor device of claim 10, wherein differences in length and height between said loops in said bond wires are less than 5%.

* * * * *